United States Patent
Ushijima et al.

(10) Patent No.: US 7,639,020 B2
(45) Date of Patent: Dec. 29, 2009

(54) POTENTIAL SENSOR AND IMAGE FORMING APPARATUS HAVING POTENTIAL SENSOR

(75) Inventors: Takashi Ushijima, Yokohama (JP); Kaoru Noguchi, Tokyo (JP); Atsushi Kandori, Ebina (JP); Yoshitaka Zaitsu, Kawasaki (JP); Kazuhiko Kato, Tokyo (JP); Toshiyuki Ogawa, Tokyo (JP); Futoshi Hirose, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 273 days.

(21) Appl. No.: 11/924,241

(22) Filed: Oct. 25, 2007

(65) Prior Publication Data

US 2008/0116897 A1    May 22, 2008

(30) Foreign Application Priority Data

Nov. 22, 2006   (JP)   ............................... 2006-316355

(51) Int. Cl.
*G01R 29/12*   (2006.01)
*G03G 15/00*   (2006.01)

(52) U.S. Cl. .................. 324/458; 324/72.5; 399/48; 399/73

(58) Field of Classification Search .................. 324/458; 399/48, 73, 91
See application file for complete search history.

(56) References Cited

U.S. PATENT DOCUMENTS 4,317,611 A    3/1982   Petersen
5,434,609 A *  7/1995   Rhodes ........................ 347/77
7,242,882 B2 * 7/2007   Ichimura et al. .............. 399/48
7,265,554 B2 * 9/2007   Ichimura et al. ............ 324/458
7,504,832 B2 * 3/2009   Kandori et al. ............. 324/457
2006/0170935 A1 * 8/2006 Mukai et al. ................. 358/1.1

FOREIGN PATENT DOCUMENTS

JP        7-13396 A     1/1995
JP        7-56414 A     3/1995

* cited by examiner

*Primary Examiner*—Timothy J Dole
*Assistant Examiner*—John Zhu
(74) *Attorney, Agent, or Firm*—Fitzpatrick, Cella, Harper & Scinto

(57) ABSTRACT

A potential sensor is provided in which the adhesion of toner particles to the potential sensor is reduced or prevented from occurring, reducing or preventing the occurrence of a situation that accurate detection cannot be performed. The potential sensor has a movable member, detecting electrodes formed on the movable member, a support which movably supports the movable member, a driving mechanism which drives the movable member, and a stationary member which supports the support. Between the movable member and the stationary member, a first gap is so formed as to make the movable member 101 movable. The first gap has a part that is not larger in width than the maximum size of toner particles when the movable member is not elastically deformed and is at a neutral position.

8 Claims, 11 Drawing Sheets

S&N POLES GENERATE ALTERNATELY

US 7,639,020 B2

POTENTIAL SENSOR AND IMAGE FORMING APPARATUS HAVING POTENTIAL SENSOR

BACKGROUND OF THE INVENTION

1. Field of the Invention

This invention relates to a potential sensor (electric-potential sensor) with which the voltage of a detection object is measured, and to an image forming apparatus having the potential sensor.

2. Description of the Related Art

A potential sensor disclosed in Japanese Patent Application Laid-open No. H07-056414 detects the surface potential of a photosensitive member charged by a charger in a digital color copying machine. In this potential sensor, the surface potential of the photosensitive member charged by setting the grid voltage of the charger at VG1 is detected, and the value detected is represented by VS1. The surface potential of the photosensitive member charged by setting the grid voltage of the charger at VG2 (provided that the voltage has the relationship of VG1<VG2) is also detected, and the value detected is represented by VS2. Then, on the basis of an absolute value ΔVS of the difference between the VS1 and the VS2 and an absolute value ΔVS' of the difference between VS1' and VS2' detected under an ideal environmental condition, the potential sensor corrects its sensitivity.

A potential sensor disclosed in Japanese Patent Application Laid-open No. H07-013396 also detects the surface potential of a photosensitive member in an image forming apparatus. This potential sensor is provided with an abnormality detector which has the following means to detect abnormal conditions of the potential sensor. That is, the abnormality detector has a means for applying at least two types of voltages to the surface whose potential is to be measured with the potential sensor, a means for causing the potential sensor to measure several times the potential of the surface, a means for calculating an average value from measured values, and a means for calculating from the measured values a maximum value and a minimum value or a difference between the two. It further has a means for judging whether or not the average value based on the two types of voltages is within a certain range, and a means for judging whether or not the maximum value and the minimum value or the difference between the two are within certain values, to thereby detect the abnormal conditions of the potential sensor by the above judging means.

In general, in the technical field of potential sensors, stains on the potential sensor are given as the cause of detection of abnormal conditions. The cause of such stains includes toner used in copying machines, or foreign matter such as paper dust and oil mist. In the techniques described in the above background art, the abnormal conditions of the sensor due to toner or the like having adhered to the sensor are managed by taking measures of, e.g., correcting sensitivity or providing an abnormality detecting means.

However, in both cases, the correction of sensitivity or the detection of abnormal conditions must be performed when the potential sensor is in use in the copying machine, during which normal potential measurement cannot be made for the potential measurement object in the copying machine. In addition, image forming apparatus is unusable because of the detection and correction of abnormal conditions.

SUMMARY OF THE INVENTION

Accordingly, an object of the present invention is to provide a potential sensor in which the above problems have been solved, and an image forming apparatus having such a potential sensor.

The potential sensor of the present invention has a movable member, a detecting electrode formed on the movable member, a support which movably supports the movable member, a driving mechanism which drives the movable member, and a stationary member which supports the support. Further, between the movable member and the stationary member, a first gap is so formed as to make the movable member movable. The first gap has a part that is not larger in width than the maximum size of toner particles when the movable member is at a neutral position.

In the above constitution, the potential sensor may be made up in the following way. That is, between the support and the stationary member, a second gap is so formed as to make the support elastically deformable. The second gap has a part that is not larger in width than the maximum size of toner particles when the movable member is at a neutral position. In the present invention, the neutral position refers to the position the movable member is at when the support does not undergo elastic deformation.

Taking the problems noted above into account, the image forming apparatus of the present invention is characterized by having the above potential sensor and an image forming unit; the image forming unit being controlled by using sensor signals obtained from the potential sensor.

According to the present invention, in virtue of such a simple constitution provided with a gap or gaps as described above, the adhesion of toner particles to the potential sensor, which is causative of the detection of abnormal conditions, can be reduced or prevented from occurring. Accordingly, it is possible to reduce the frequency of correcting the sensitivity of the potential sensor, or detecting abnormal conditions, because of the adhesion of toner particles. Thus, the potential sensor can stably be used over a relatively long period of time, and the image forming apparatus having such a sensor can stably be used over a long period of time.

Further features of the present invention will become apparent from the following description of exemplary embodiments with reference to the accompanying drawings.

DESCRIPTION OF THE EMBODIMENTS

Figure 1A:
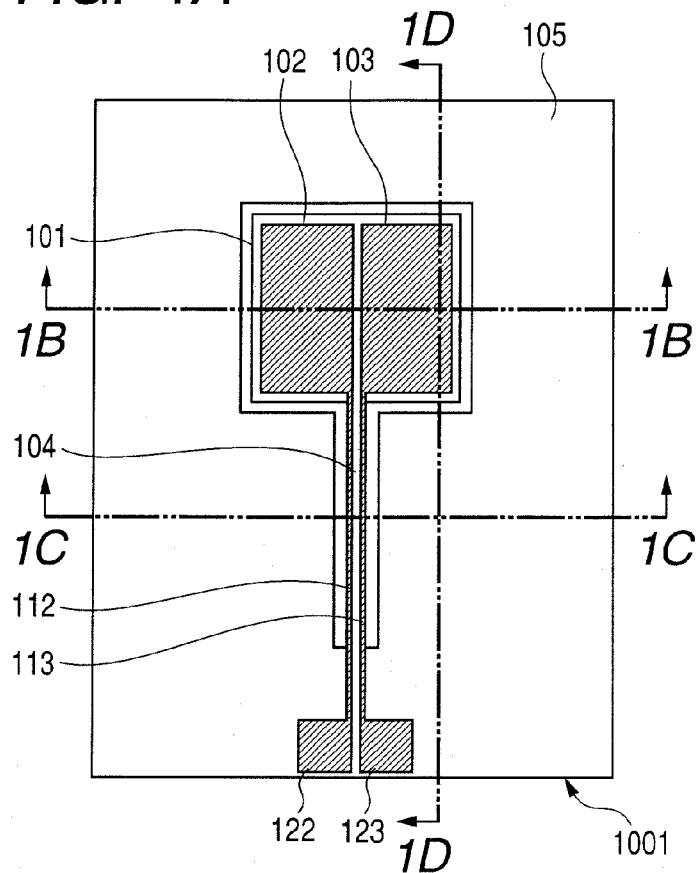
FIG. 1A illustrates an example of a sensor element in the potential sensor of the present invention.

Preferred embodiments of the present invention will be described in detail in accordance with the accompanying drawings.

The potential sensor according to the present embodiment has a movable member which is shakable around a torsional axis, two detecting electrodes formed symmetrically on the movable member interposing the torsional axis between the electrodes, a torsionally elastically deformable beam which is a support movably supporting the movable member, a driving mechanism which shakes the movable member, and a stationary member which supports the beam. Between the movable member and the stationary member, a first gap is formed which extends substantially along the external shape of the movable member except for the connecting part between the movable member and the beam, to make the movable member movable. This first gap has a part that is not larger in width than the maximum size of toner particles when the beam does not undergo torsional elastic deformation and the movable member is at a neutral position. The sectional shape of the first gap in its plane perpendicular to the direction in which it extends is, for example, a rectangular shape extending with the same width in the thickness direction.

Between the beam and the stationary member, a second gap is formed extending substantially along the external shape of the beam except for the connection part between the movable member and the beam and the connecting part between the stationary member and the beam, to make the beam torsionally elastically deformable. This second gap also has a part that is not larger in width than the maximum size of the toner particles when the movable member is at the neutral position. The sectional shape of the second gap in its plane perpendicular to the direction in which it extends is, for example, a rectangular shape extending in the same width in the thickness direction.

In the above constitution, where a magnet or electromagnet of the driving mechanism is provided relatively closely to the first gap, since it is easy for the toner particles to enter the interior through the first gap, the narrowest part of the first gap may be set to be narrower than the narrowest part of the second gap. The first gap whose shape changes may also be designed so that, not only when the movable member is at the neutral position but also while being shaken or swung at a certain shake or swing angle, the narrowest part thereof is not larger in width than the maximum size of the toner particles. The second gap as well may likewise be designed. As to the sectional shape, the above gaps may each have, besides the rectangular shape, any of the following shapes as seen in the embodiments given later. That is, the gaps may each have a two-stage double-rectangular shape the narrow part of which is on the top side of the gap, a lozenge shape the narrow part of which is on each of the top side and bottom side of the gap, a tapered shape the narrow part of which is on the top side of the gap, or an arc shape which is outward curved substantially around the torsional axis.

This embodiment is described below in detail with reference to the drawings. It is first described how the potential sensor of the present embodiment is made up as a whole. A potential sensor of a feedback system or a zero potential method is described here. The present invention is also applicable to potential sensors of other systems as exemplified by a potential sensor of a system called a deflection method in which induced charge detection signals of an induced-charge detector are outputted as potential measurement signals of a detection object.

Figure 2:
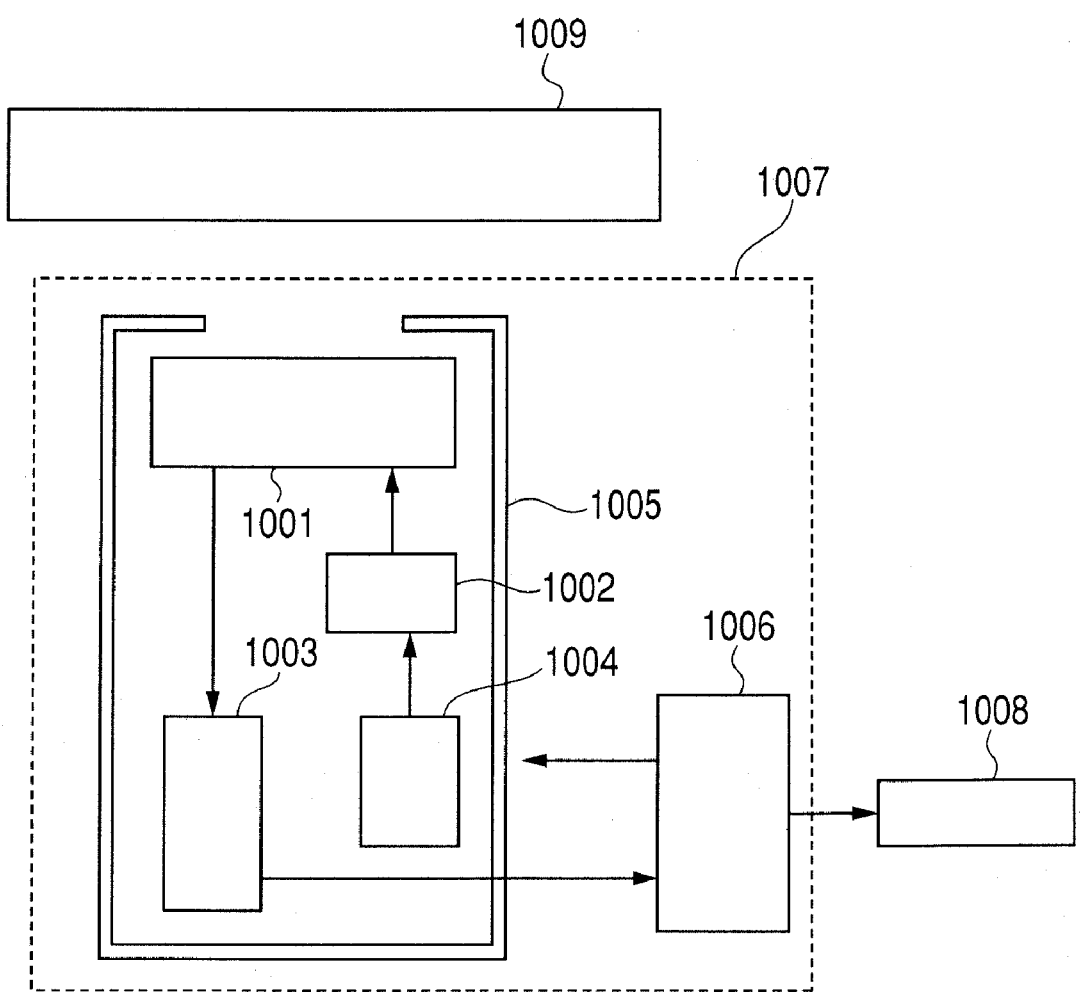
FIG. 2 illustrates an example of the inner structure of the potential sensor of the present invention.

As an example of how the potential sensor of the feedback system according to the present embodiment is made up as a whole, the constitution made up as shown in FIG. 2 is available. In FIG. 2, the potential sensor of the present embodiment, denoted by 1007, consists basically of a sensor head 1005 and a latter-stage processing circuit 1006. A sensor element 1001 (which corresponds to an element having the movable member on which the above detecting electrodes are placed), a sensor element driving element 1002 (which corresponds to the above driving mechanism), a former-stage processing circuit 1003, a drive processing circuit 1004 and so forth are set in the interior of the sensor head 1005. Herein, signals transmitted from the sensor element 1001 to the former-stage processing circuit 1003 are called primary sensor signals, signals transmitted from the former-stage processing circuit 1003 to the latter-stage processing circuit 1006 are called secondary sensor signals, and signals coming out of the latter-stage processing circuit 1006 are called sensor output signals.

In this constitution, the performance and necessity of the former-stage processing circuit 1003 and latter-stage processing circuit 1006 may change depending on the performance required for the sensor.

It is described below how the above respective constituents operate. The sensor element 1001 is so disposed as to face a detection object 1009. The sensor element driving element 1002 is provided in order to drive the sensor element 1001. The primary sensor signals obtained from the sensor element 1001 are subjected to amplification process or differential amplification process in the former-stage processing circuit 1003, and are transmitted to the latter-stage processing circuit 1006. On the basis of the secondary sensor signals transmitted from the former-stage processing circuit 1003, the latter-stage processing circuit 1006 transforms reference potential of the sensor head (e.g., a sealed case) 1005 so that the secondary sensor signals becomes 0 (or not more than a preset value). Normally, the signals from a sensor signal processing circuit, i.e., the former-stage processing circuit 1003 becomes approximately 0 when the reference potential of the sensor head 1005 becomes equal to the potential of the detection object 1009. Since the voltage applied to the sensor head 1005 is known, the latter-stage processing circuit 1006 outputs the value to a signal processing unit 1008 as sensor output signals.

The present embodiment is characterized by the shape of the part of the sensor element 1001. The characteristic portions of the sensor element in the present embodiment will be described next with reference to FIGS. 1A to 1D to FIGS. 6A and 6B.

In the sensor element 1001 of the present embodiment shown in FIG. 1A to 1D, detecting electrodes 102 and 103 disposed opposite to a detection object (which is on the front side of the paper face on which FIG. 1A is drawn) are formed using a conductive material. The detecting electrodes 102 and 103 are supported on a movable member 101, and the movable member 101 is supported with a single beam 104. The single beam 104 is supported by a stationary member 105 at the base portion thereof. These make up the sensor element 1001. The detecting electrodes 102 and 103 are electrically connected to the former-stage processing circuit 1003 through wirings 112 and 113 and electrode pads 122 and 123, respectively.

In order to obtain the primary sensor signals mentioned previously, torsional motion is given to the beam 104 and shakes the movable member 101 around the torsional axis to change the distance between the detection object and the detecting electrodes 102 and 103.

The detecting electrodes 102 and 103 are provided making a pair on both sides of a center axis formed on the prolonged line of the beam 104. Thus, the movable member 101 is shaken as stated above, where, as in a seesaw, one detecting electrode approaches the detection object and the other detecting electrode comes away from the detection object. Accordingly, signals obtained respectively from the detecting electrodes 102 and 103 come into such a relationship that their phases are shifted by 180 degrees. Hence, for example, these signals of two types can be subjected to differential amplification, so that output signals having a high S/N ratio can be obtained.

Figure 1D:
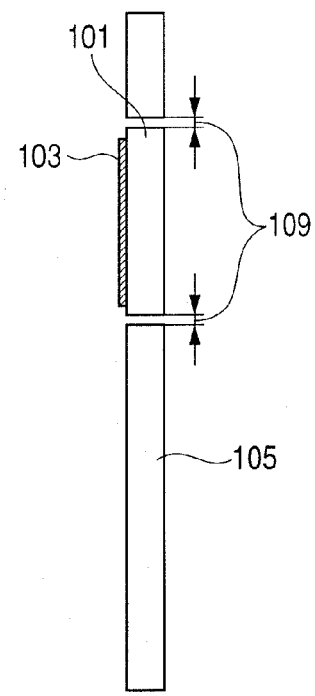
FIG. 1D is a sectional view taken along the line 1D-1D of FIG. 1A.
Figure 1B:
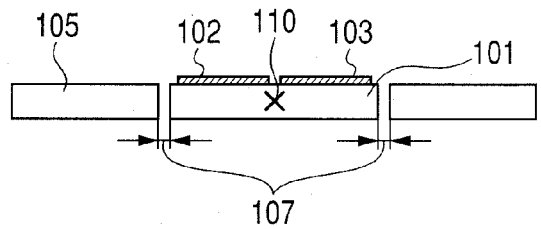
FIG. 1B is a sectional view taken along the line 1B-1B of FIG. 1A.
Figure 1C:
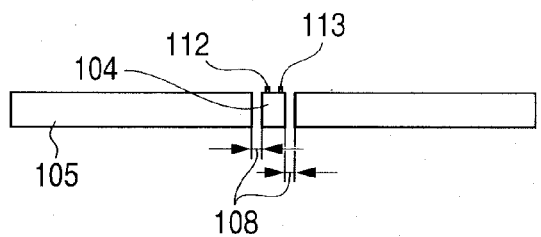
FIG. 1C is a sectional view taken along the line 1C-1C of FIG. 1A.

In the FIG. 1A plan view, the first gap between the movable member 101 and the stationary member 105 corresponds to a gap 107 shown in FIG. 1B and a gap 109 shown in FIG. 1D. The second gap between the beam 104 and the stationary member 105 corresponds to a gap 108 shown in FIG. 1C. The width of the gap 109 never changes when the movable member 101 shakes, whereas the width of each of the gap 107 and gap 108 change as the movable member 101 shakes. These gaps may be designed in accordance with the particle size distribution of toner particles which are present around the potential sensor. The gaps are designed so that the movable member 101 and the beam 104 do not hit against the stationary member 105 when the movable member 101 shakes.

In this case, the gap 107 between the movable member 101 and the stationary member 105 may be set to be narrower than the gap 108 between the beam 104 and the stationary member 105. This is because the beam 104 and the movable member 101 are different from each other in distance at which they approach the stationary member 105. When the beam 104 is twisted, the beam 104 approaches the stationary member 105 to a greater extent than the movable member 101, and hence the gap 108 between the beam 104 and the stationary member 105 should be set to be relatively broad. Concurrently therewith, the gap 107 between the movable member 101 and the stationary member 105 should be set to be narrower for the following reasons.

This matter is described with reference to FIGS. 3A and 3B. As shown in FIG. 3B, a magnet 201 is provided on the back side of the movable member 101 in the potential sensor shown in FIG. 3A. Toner particles are attracted by magnetic force, and hence the magnet 201 of a driving mechanism shown in FIG. 3B acts to attract the toner particles. The force exerted by the magnet 201 to attract toner particles is in proportion to the square of the distance between the magnet 201 and the toner particle. Therefore, the probability that toner particles pass through the gap 108 surrounding the beam 104 far from the magnet 201, is smaller than the probability that toner particles pass through the gap 107 between the movable member 101 near to the magnet 201 and the stationary member 105.

Accordingly, as a measure to prevent the toner particles from coming around to the back surface of the sensor element, the gap 108 between the beam 104 and the stationary member 105 and the gap 107 between the movable member 101 and the stationary member 105 are so designed as to differ in size from each other in order for the sensor not to be hindered from operating and for the toner particles to be prevented from coming around to the back. Specifically, the gap 108 between the beam 104 and the stationary member 105 is set to be broader than the gap 107 between the movable member 101 and the stationary member 105. Thus, the toner particles can be prevented from adhering to the magnet 201 without hindering the intended torsion.

Of course, the gap 108 between the beam 104 and the stationary member 105 and the gaps 107 and 109 between the movable member 101 and the stationary member 105 may be set to be substantially equal to each other depending on the level of torsion and the particle size distribution of toner particles.

Figure 4:
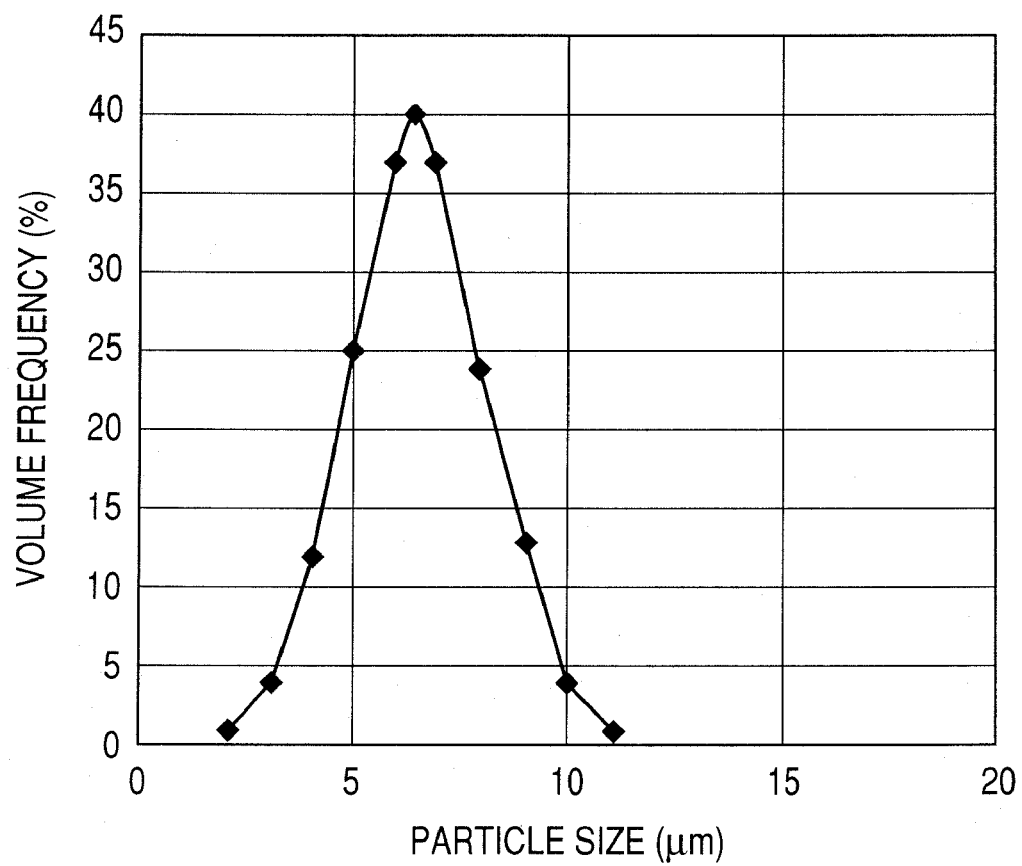
FIG. 4 is a graph showing an example of particle size distribution of toner particles used in electrophotography.

The design of the above gaps will be described below. FIG. 4 is a graph showing an example of the particle size distribution of the toner particles used in electrophotography. In this case, the toner particle size is in the range from several microns (μm) to ten several microns (μm), and a peak is present at about 7 μm. In such a case, it is desirable for the gaps to be not more than ten several microns (μm) in width, so that the toner particles can be prevented from coming around to the back surface of the sensor element. In particular, when the gaps may be set to be not more than about 7 μm, the effect of preventing the toner particles from coming around can be more effectively exhibited.

The reason why the gaps are set to be substantially not more than the maximum value of particle size distribution is that, among the toner particles, larger particles have a greater influence when they adhere to the movable member 101 or the magnet 201. In this case, the gap 107 between the movable member 101 and the stationary member 105 is so designed as to have the above value, but the gap 108 between the beam 104 and the stationary member 105 may be so designed as to be larger than the above value depending on the level of torsion. Of course, the gap 108 as well may be so designed as to have the above value. The same applies also to the gap 109 between the movable member 101 and the stationary member 105.

In the above constitution, the detecting electrode may be single. In this case, a single detecting electrode is disposed on one side with respect to a center axis 110 of torsional motion, where the primary sensor signals is processed in a manner different from the above. Two of the beam 104 may be provided on both sides interposing the movable member 101 between the beams. Also in this constitution, the gaps are provided in the same designing manner as described above.

Further, in the constitution in which the single detecting electrode is provided, a swing form may be adopted in which the movable member 101 is so driven as to bend substantially around an axis intersecting the base portion of the beam 104 connected to the stationary member 105, in the direction substantially perpendicular to the paper face on which FIG. 1A is drawn. In this case, the width of the beam 104 may be set to be large so as to be adaptable to the swing form. With the constitution in this case, taking into account the fact that the gap 109 shown in FIG. 1D changes, but the other gaps do not change so much, the gaps may be designed according to the designing manner described above and depending on the constitution. In any case, the present invention is characterized in that in the potential sensor which is made up so that the gaps are formed as above in order to make the movable member movable with respect to the stationary member, the gaps are so provided as to enhance the effect of preventing the toner particles from undesirably entering the interior of the sensor head.

The principle by which the potential sensor of the present embodiment generates sensor output signals is explained below.

Electrostatic capacity (C) produced between a detecting electrode and a detection object is changed with a change in distance (g) between the detection object and the detecting electrode or in area (s) of the detecting electrode facing the detection object.

The electrostatic capacity (C) may commonly be expressed by Equation 1.

$$C = \epsilon \cdot s/g. \quad (1)$$

$\epsilon(F \cdot m^{-1})$: the dielectric constant of substance between the detection object and the detecting electrode.

g(m): the distance between the detection object and the detecting electrode.

$s(m^2)$: the area of the detecting electrode facing the detection object.

The electrostatic capacity (C) also has a relationship expressed by Equation 2. Q is the quantity of electric charges induced by the detecting electrode.

$$Q = C \times Vd. \quad (2)$$

Vd(V): the electric potential of the detection object.

From Equations 1 and 2, the following Equation 3 is obtained.

$$Q = (\epsilon \cdot s/g) \times Vd. \quad (3)$$

Any one of $\epsilon$, s and g is periodically changed, whereby a periodic change of Q is obtained. Where Q is a value that changes with time, Equation 3 can be converted into an expression of dQ/dt. This dQ/dt has the same meaning as electric current, and hence the value of Vd can be read as the electric current. This electric current produces primary sensor signals.

In this case, the processing of amplifying the primary sensor signals or increasing the S/N ratio is, as needed, performed by the processing circuit to produce secondary sensor signals. In the feedback system, feedback control is carried out as described previously so that the secondary sensor signals become zero, whereas, in the deflection method, the secondary sensor signals are used to detect the electric potential of the detection object. The present invention is applicable to any sensors inclusive of such systems as long as they are potential sensors which are so made up as to be provided with gaps between a movable member and a stationary member in order to make the movable member movable with respect to the stationary member.

To obtain the potential sensor of the present embodiment, commonly available mechanical working or semiconductor processing may be used. In the case where the semiconductor processing is used, for example, a silicon wafer (hereinafter referred to as "matrix" in some cases) may be used. An electrical insulating layer is optionally formed on the surface of the silicon wafer, and the detecting electrodes 102 and 103 are formed thereon. Thereafter, the silicon wafer may be processed by dry etching, wet etching, sand blasting or laser abrasion to produce the movable member 101 or the beam 104.

Figure 5A:
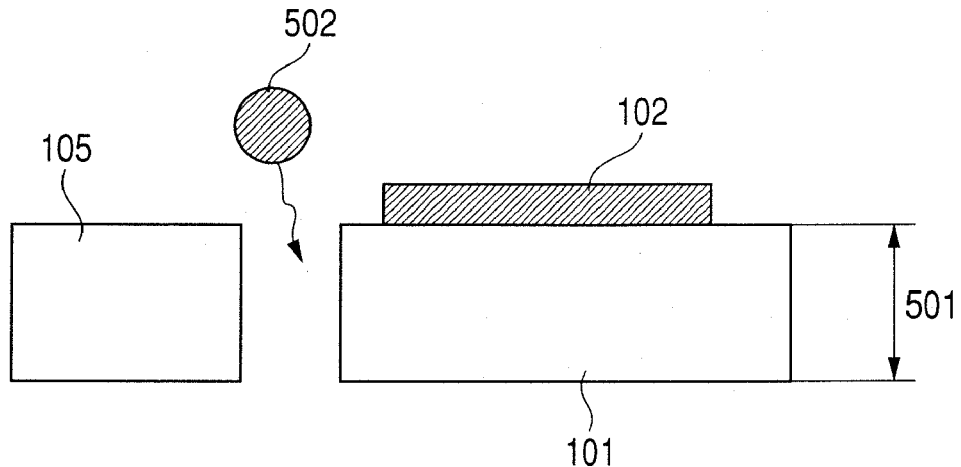
FIGS. 5A, 5B and 5C illustrate an example in which a toner particle is going to enter a gap.
Figure 5B:
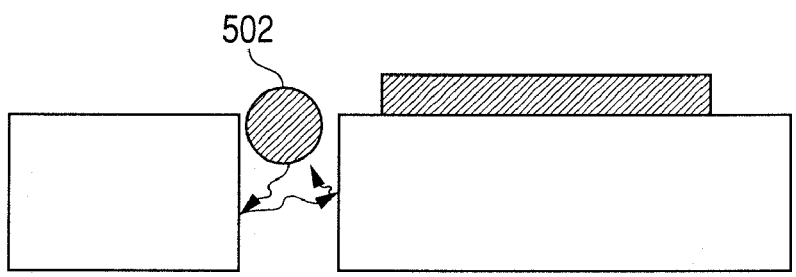
Figure 5C:
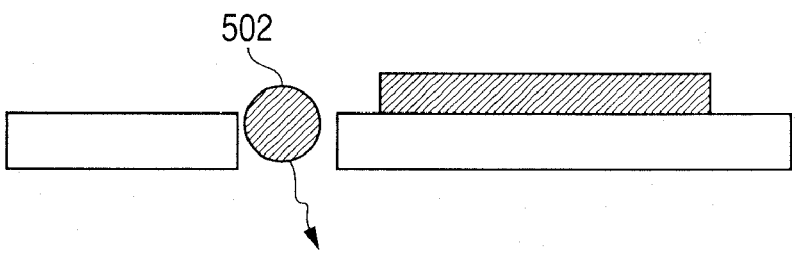

In this case, the movable member 101 is so formed as to be tens of microns (μm) to several millimeters (mm) in one-side length and several microns (μm) to hundreds of microns (μm) in matrix thickness. The matrix thickness is described with reference to FIGS. 5A to 5C. The larger the thickness 501 of the matrix is, the more preferable. As the matrix is thicker, it becomes more difficult for a toner particle 502 to undesirably enter the gaps, as shown in FIGS. 5A and 5B. If the matrix has a relatively small thickness with respect to the toner particle, it becomes easy for the toner particle to enter the gap, as shown in FIG. 5C. However, there is the limit of the thickness, and hence, in conformity with other constitutions, the sensor element should be appropriately designed so that the effect of preventing the toner particles from undesirably entering the sensor head interior can sufficiently be brought out according to demand.

In this case, the matrix need not be limited to the silicon wafer, and either a compound semiconductor substrate or a glass substrate may be used. Where the matrix has an electrical conductivity and there is the fear that the detected signals of the detecting electrodes might leak to the movable member, an electrically insulating layer may be formed between the movable member and the detecting electrodes. As materials for the detecting electrodes, metal materials used commonly in semiconductor processing, such as Au, Pt, Ti, W, Mo, Cr, Al and Cu, may be used singly or used to form a multiple layer.

In the above constitution, the driving mechanism is provided in order to shake or swing the movable member 101. Magnetic force, electrostatic attraction force or distortion force may be used as driving force.

Figure 3A:
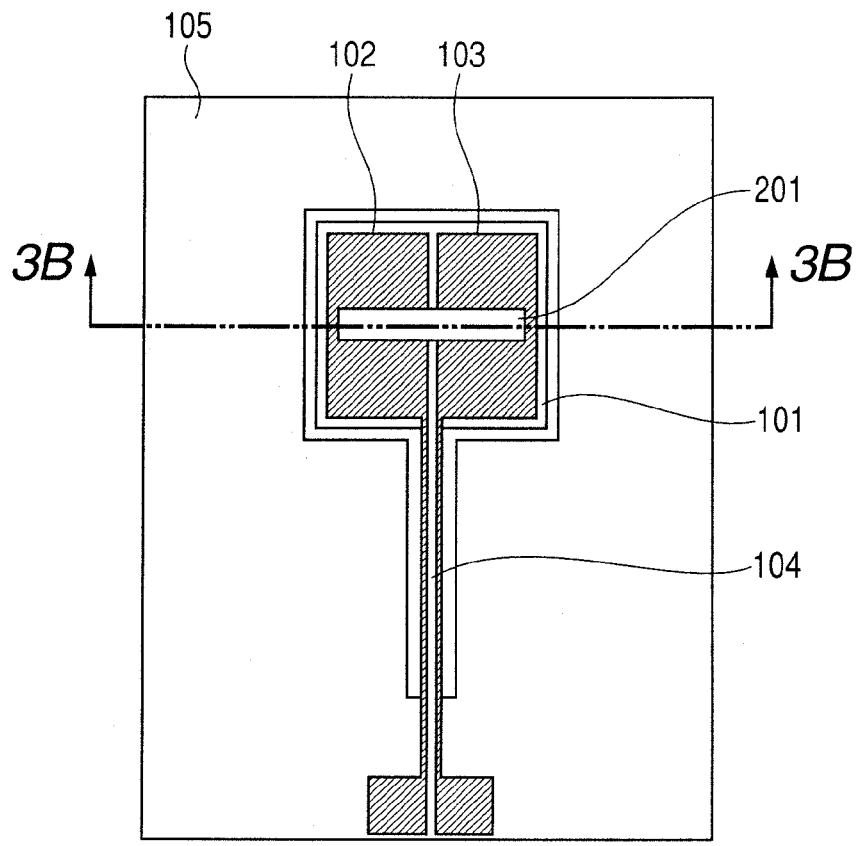
FIG. 3A illustrates an example of the driving mechanism of the sensor element in the potential sensor of the present invention.
Figure 3B:
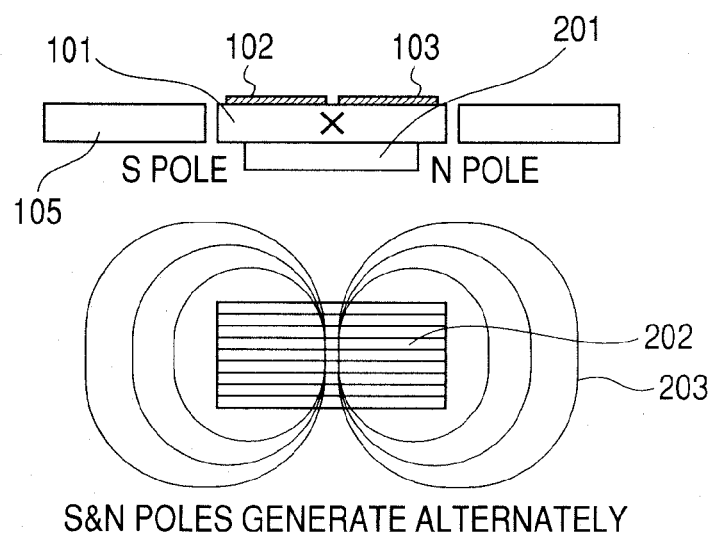
FIG. 3B is a sectional view taken along the line 3B-3B of FIG. 3A

In the case where the magnetic force is used, for example, as shown in FIGS. 3A and 3B, the magnet 201 or a high-permeability material such as PERMALLOY (registered trademark) is bonded to the movable member 101 on the side opposite to the side on which the detecting electrodes are formed (hereinafter referred to as "the back surface of the movable member"). Then, a magnetic coil 202 is formed in the vicinity thereof, and an electric current is flowed through the coil 202 to generate a magnetic field 203. The magnet 201 or the high-permeability material such as PERMALLOY (registered trademark) comes under attraction force or repulsion force from the magnetic field the coil 202 generates. This attraction force or repulsion force causes the movable member 101 to shake or swing. To periodically drive the movable member 101, the electric current applied to the coil 202 may be in pulse form or the direction in which the electric current is flowed may periodically be changed to alternately generate an S pole and an N pole. As shown in FIGS. 3A and 3B, the magnet 201 may be provided in the direction perpendicular to the direction in which the beam 104 extends, whereby a torsional mode is easy to generate.

In the case where, e.g., the electrostatic attraction force is used, an electrode for generating electrostatic attraction force is provided at part of the movable member 101 or beam 104. Then, an electrode opposite to the former electrode is provided at a fastening part (which is the part where the stationary member 105 is fastened) in the vicinity of the movable member, and a voltage is applied across the above two electrodes to generate the electrostatic attraction force to cause the movable member 101 shake or swing. In this case, it follows that the electrode for generating electrostatic attraction force is provided in addition to the detecting electrodes. In order to obtain a large electrostatic attraction force, it is desirable that the electrode for generating electrostatic attraction force has a large area. Accordingly, the electrode for generating electrostatic attraction force may preferably be formed on the back surface of the movable member 101.

In the case where the distortion force is used, for example, a piezoelectric material element may be used. The piezoelectric material element may be formed on the beam 104 or in the vicinity of the beam 104 and allowed to operate, whereby the beam 104 and the movable member 104 can be driven by the distortion force due to changes in shape of the piezoelectric material element.

In these cases, the period of drive depends on the electric current applied for the drive. Where resonant drive along with torsional motion should be effected, an electric current may be applied in a period adjusted to the resonant frequency.

In the case where such a driving mechanism is provided on the back surface of the movable member 101, drive characteristics deteriorate as the toner particles adhere to the driving mechanism and movable member 101, thereby causing the drive characteristics of the sensor to change. For example, the resonant frequency shifts or the electric current necessary for the drive increases, to thereby make it unable in some cases to continue stable drive.

The toner particles may come around to the back surface of the movable member 101 also because of diffusion of the toner particles in the air. However, where they are magnetic material particles or charged particles, they are attracted by magnetic force or electrostatic attraction force used in the drive, and come around to the back surface of the movable member 101. In the present embodiment, the sensor is designed so that the gaps each have a part that is not larger in width than the maximum size of toner particles, thereby reducing the toner particles coming around to the back surface of the movable member 101, or preventing the toner particles from coming around to the back surface of the movable member 101, and as a result, the potential sensor can be allowed to stably function and abnormal conditions detected by the potential sensor can be lessened or prevented from occurring. Thus, it is possible to stably use the potential sensor and the image forming apparatus having such a potential sensor.

Figure 6A:
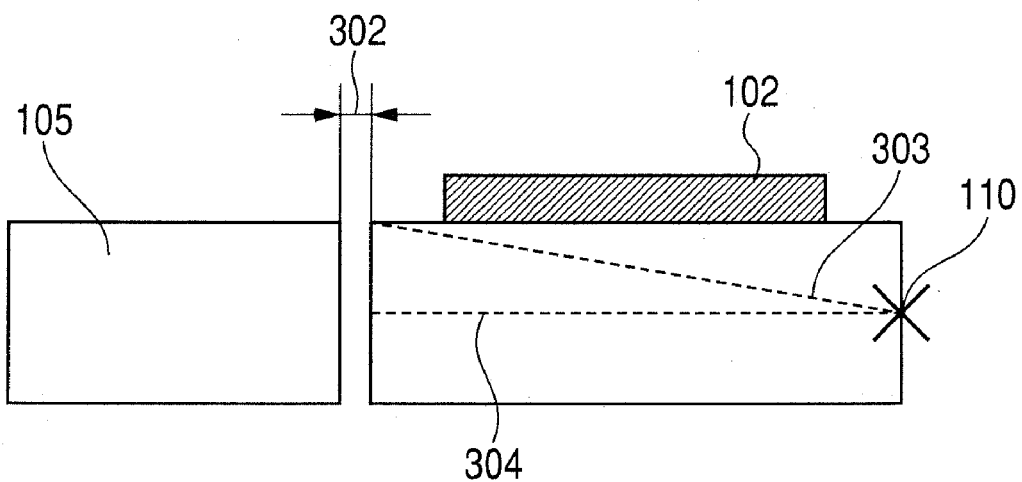
FIGS. 6A and 6B illustrate an example of how the movable member of the sensor element in the potential sensor of the present invention moves.
Figure 6B:
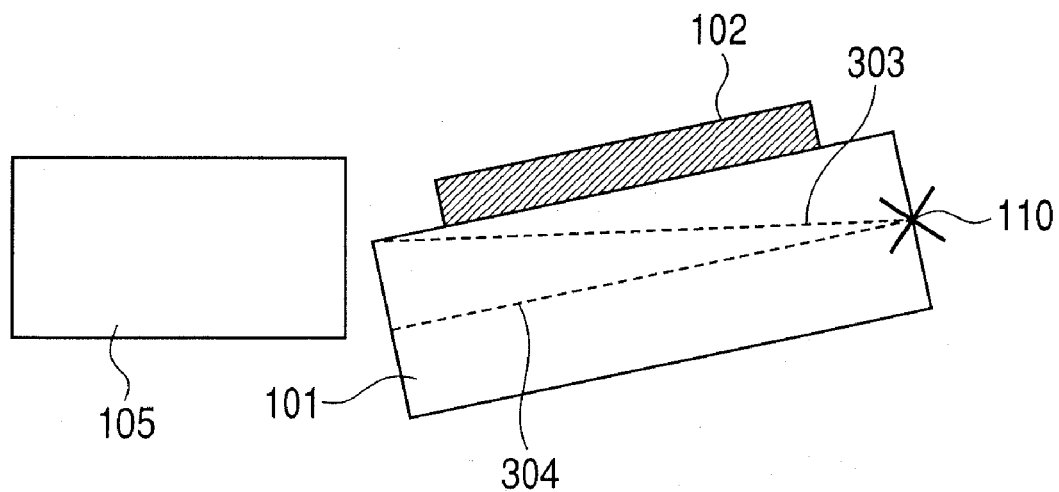

It is further described below how to design the gaps. FIGS. 6A and 6B illustrate an example of how the movable member of the sensor element in the potential sensor of the present embodiment moves. When the movable member 101 shakes around the torsional axis 110 that forms a center axis (which is on the same axis as the beam 104), it is desirable for a gap 302 to be larger in width than the length found by subtracting half a length 304 of one side (latus) of the movable member 101 from half a length 303 of the diagonal line of a movable member cross section. More specifically, it is preferable for the gap to be designed so that the movable member 101 does not hit against the stationary member 105 when the movable member comes into the state shown in FIG. 6B, i.e., comes closest to the stationary member at the corner at which the segment shown by half the length 303 of the diagonal line of the movable member cross section intersects. Where the particle size distribution of toner particles is previously known, according to which the gap 302 is to be designed, the length found by subtracting half the length 304 of one side of the movable member 101 from half the length 303 of the diagonal line of the movable member cross section is determined according to how the gap 302 is designed. Thus, the size of the movable member 101 and the thickness of the matrix can be determined on the basis of this length.

However, where the level of the maximum displacement due to shake does not reach what is shown in FIG. 6B, the gap 302 is not necessarily required to be made longer than the length found by subtracting half the length 304 of one side of the movable member 101 from half the length 303 of the diagonal line of the movable member cross section.

If, in the potential sensor as shown in FIGS. 1A to 1D, it is attempted to shake the movable member 101 at a too large shake angle, power for shaking increases, and at the same time, a change in the distance between the detecting electrodes and the detection object and a change in the area at which the detecting electrodes face the detection object complicatedly cancel each other, resulting in an increase in noise of signals of electric potential. Accordingly, from the viewpoint of improving detection precision, it is preferable that the movable member is shaken with an increased frequency at a small shake angle. For example, the shake angle may be about 3 degrees. Inasmuch as it shakes at such a small shake angle, and where the width of the above gap to be given when the movable member 101 is at the neutral position is set to have the value stated previously, this value can be kept substantially not more than the maximum value of the particle size distribution of toner particles even when the movable member is shaken. Even if the width of the gap instantaneously becomes substantially more than the maximum value of the particle size distribution by any chance when the movable member is shaken, such instantaneous occurrence has no much influence. From such a viewpoint as well, it can be understood that the first gap is so designed as to have the part that is not larger in width than the maximum size of toner particles when the movable member is at a neutral position, thereby effectively preventing the toner particles from entering the interior of the sensor head unwantedly.

EXAMPLES

Some embodiments of the sensor element according to the potential sensor of the present invention are given below with reference to the sectional views shown in FIGS. 7A to 7E. These sectional views show examples of the sectional shape of a gap on the plane perpendicular to the direction in which the gap extends.

Figure 7A:
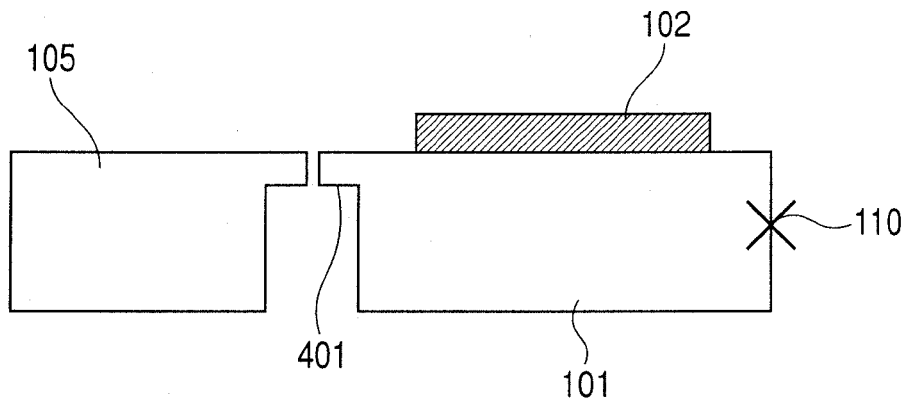
FIGS. 7A, 7B, 7C, 7D and 7E illustrate some examples of the sensor element in the potential sensor of the present invention.
Figure 7B:
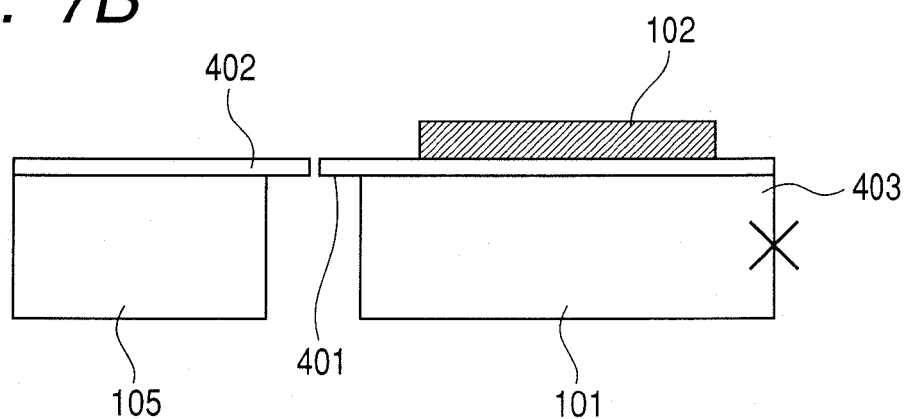

In the embodiments shown in FIGS. 7A and 7B, the gap has, as its sectional shape, a counter boring shape (a step-like shape). That is, this is a two-stage double-rectangular shape the narrow part of which is on the top side of the gap. In a method of forming such a counter boring shape 401 having a narrow part and a broad part, for example, the shape shown in FIG. 7A can be created by multi-stage etching which is one of etching techniques. This technique produces a step-like shape using masks in layers. The shape shown in FIG. 7B can be created by previously forming a heterogeneous material 402 on a matrix 403, then first etching the heterogeneous material 402 in a small width, and second etching the matrix 403 in a large width. As the heterogeneous material, for example, a silicon thermal-oxide film may be used. At least the gap at the narrow part is not larger in width than the maximum size of toner particles which are present around the potential sensor. This embodiment is suited for an example in which the movable member 101 does not hit against the stationary member 105.

Figure 7C:
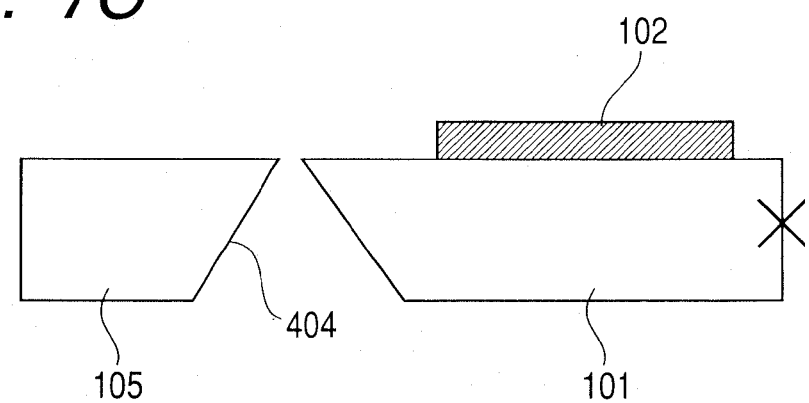

In the embodiment shown in FIG. 7C, the gap has, as its sectional shape, a tapered shape the narrow part of which is on the top side of the gap. To achieve such a tapered shape 404, for example, crystal anisotropic etching may be used. At least the gap at the narrow part is not larger in width than the maximum size of toner particles which are present around the potential sensor. This embodiment is also suited for an example in which the movable member 101 does not hit against the stationary member 105.

Figure 7D:
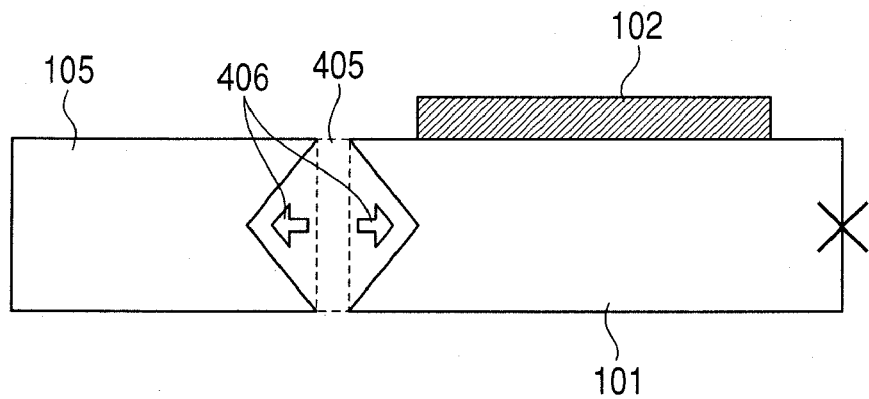

In the embodiment shown in FIG. 7D, the gap has, as its sectional shape, a depressed shape as shown in the drawing. That is, this is a lozenge shape the narrow part of which is on each of the top side and bottom side of the gap. To achieve such a depressed shape 407, for example, a through-hole 405 (shown by dotted lines) is first formed by through-etching, followed by crystal anisotropic etching carried out in the direction shown by arrows 406 and for the surfaces of the movable member 101 and the stationary member 105 facing each other. In this case, the through-etching carried out first is not necessarily required depending on how the width of the gap and the thickness of the matrix are designed. The shape shown in FIG. 7D can be achieved only by the crystal anisotropic etching. At least the gap at the narrowest part (either or both of the uppermost part or the lowermost part) is not larger in width than the maximum size of toner particles which are present around the potential sensor. This embodiment is also suited for an example in which the movable member 101 does not hit against the stationary member 105.

Figure 7E:
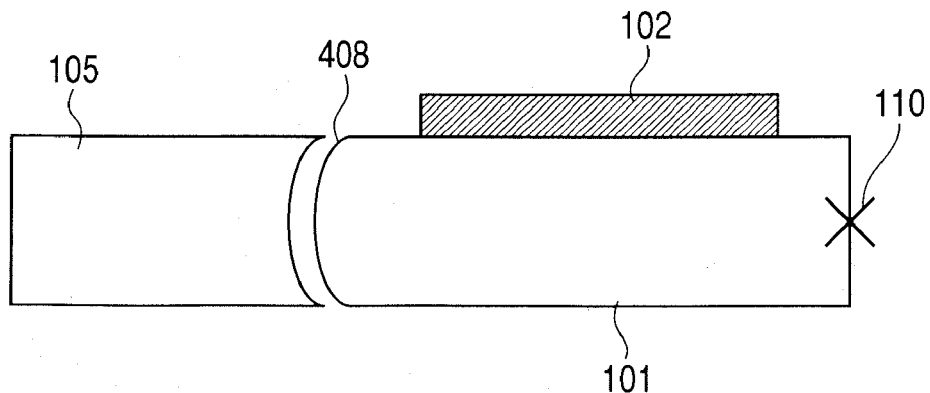

In the embodiment shown in FIG. 7E, the gap has, as its sectional shape, a curved shape as shown in the drawing. That is, this is an arced shape which is curved outward substantially around the torsional axis 110. In this case, it is desirable that when being explained with reference to FIG. 6, the curved surface on the side of the movable member 101 has a curvature radius (r) 408 which is equal to the length denoted by reference numeral 304 in FIG. 6A. As a method of making such a shape, in semiconductor processing, the matrix is etched in the oblique direction from both of its top and bottom surfaces, whereby the shape close to what is shown in FIG. 7E can be achieved. This embodiment is an example preferable in that the width of the gap between the movable member 101 and the stationary member 105 is hardly changed even during operation.

Of course, the shapes of the gaps in the above embodiments may also be formed by commonly available machining.

When the gap having any of the shapes described with reference to FIGS. 7A to 7E is provided, the toner particles can be reduced entering, or prevented from entering, the interior while the movable member 101 stands still at a neutral position. Usually, the potential sensor is driven for a short period of time (e.g., about several seconds) at certain preset timing to measure the electric potential of the detection object. Thus, the driving time is very shorter than non-driving time, and hence, even in the case where the constitutions according to the above embodiments are applied only during non-driving time, the effect of reducing the toner particles entering the interior, or preventing the toner particles from entering the interior, can be exhibited.

To make the sensor applicable also during driving time, the structure and shake or swing are designed so that every part of the gap between the movable member 101 and the stationary member 105 is not too much separate even due to the torsional motion of the beam 104. Specifically, the gap between the movable member 101 and the stationary member 105 is so set as not to become more separated than the maximum size of toner particles. However, as stated previously, the sensor is effective even when being designed so that some part of the gap instantaneously becomes larger in width than the maximum size of toner particles. Further, as stated previously, since the shake or swing angle is sufficiently small in many cases, there are only a few cases in which the gap becomes extremely large. In the embodiments shown in FIGS. 7A to 7E, it can be said that the gap is so set as to be always smaller in width than the maximum size of toner particles.

Figure 8:
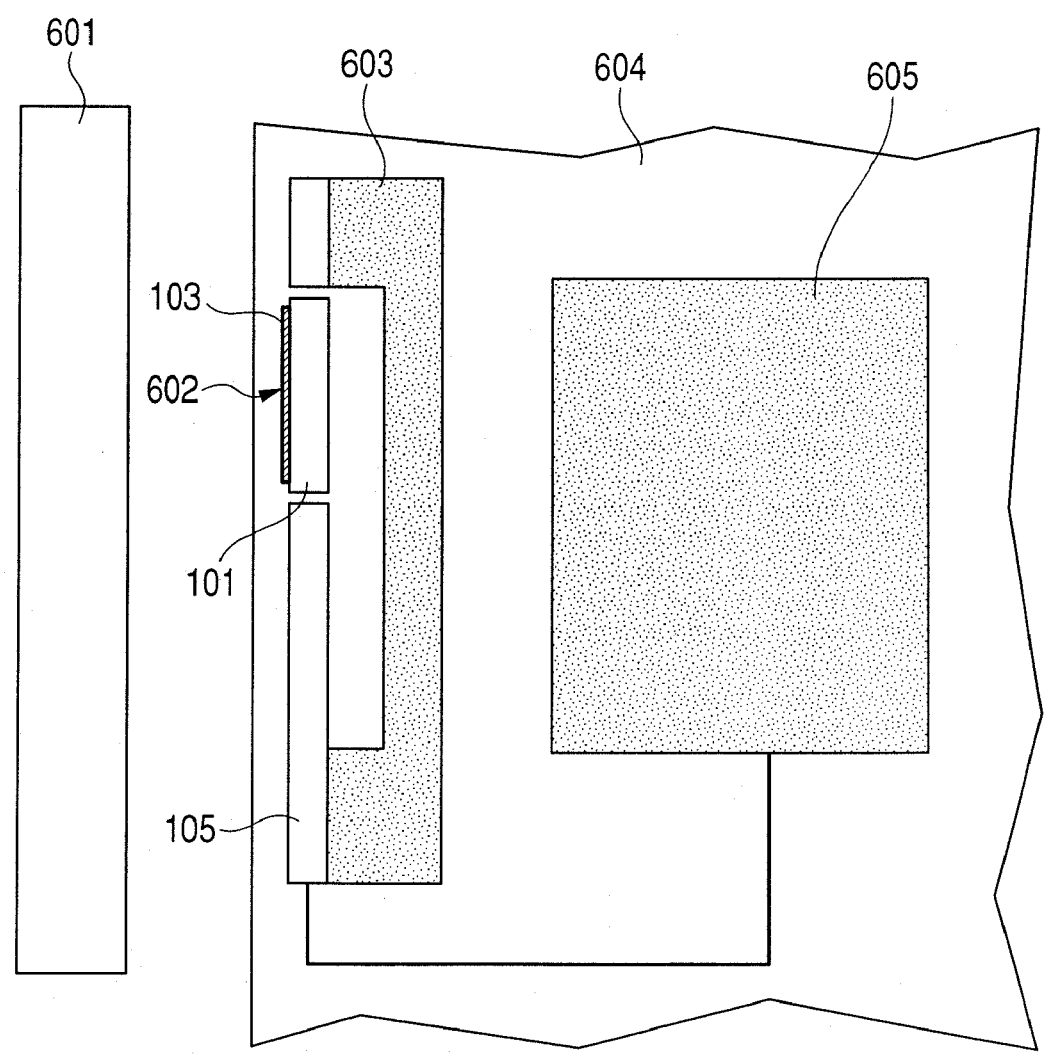
FIG. 8 illustrates an example of a sensor head in the potential sensor of the present invention.

FIG. 8 shows an example of how an embodiment of the sensor head of the potential sensor according to the present invention is made up as a whole, and partially illustrates an embodiment of a potential sensor placed opposite to a detection object 601. In this example, a sensor element 602 is supported, for example, on a bearing member or fixing base 603. The bearing member 603 is placed on a PCB substrate 604. A former-stage processing circuit 605 formed beforehand on the PCB substrate 604 and the detecting electrodes are electrically connected.

Where the bearing member 603 has such a structure as to close the back surface side of the sensor element 602, toner particles having entered this side through the gap gather in the space formed by the sensor element 602 and the bearing member 603, so that they may have the adverse effect stated previously. Where the bearing member 603 has such a structure as not to close the back surface side of the sensor element 602, it is difficult for toner particles having entered this side through the gap to gather in the space formed by the sensor element 602 and the bearing member 603. Nevertheless, there is a possibility that the adverse effect stated previously is exhibited. There is also a possibility that the toner particles adhere to the former-stage processing circuit 605 to exhibit an adverse effect on circuit operation.

According to the above embodiments of the present invention, these adverse effects can be reduced or prevented from being exhibited.

Figure 9:
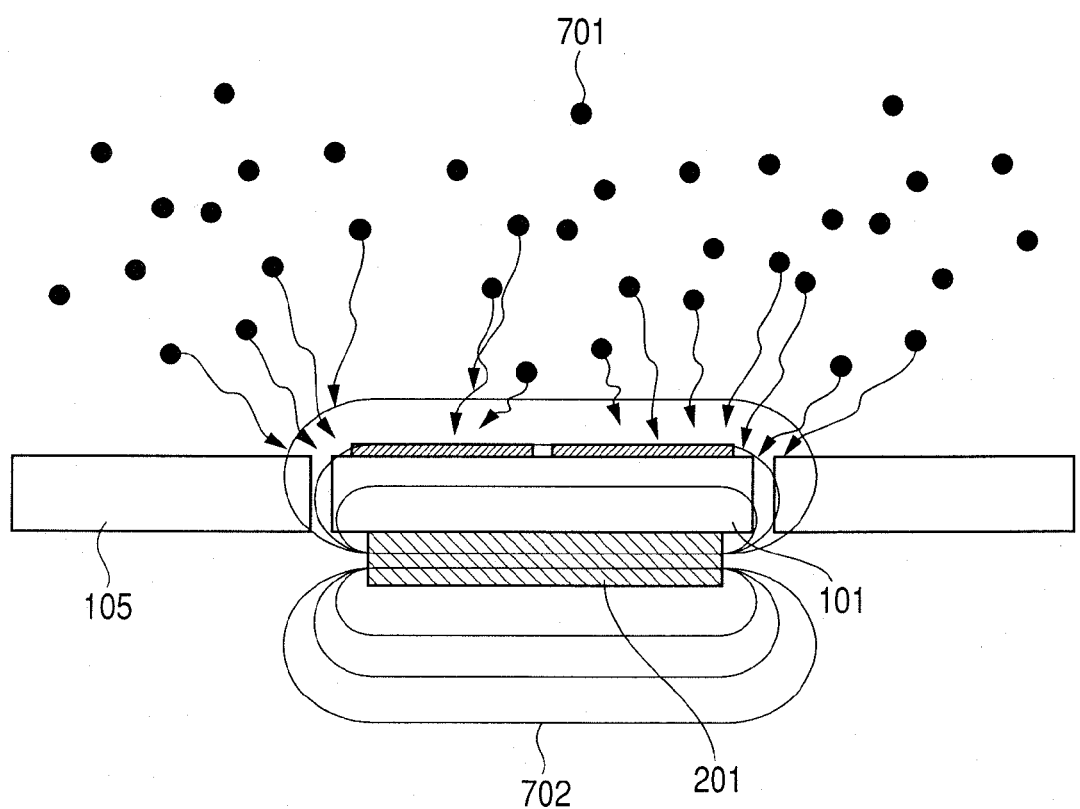
FIG. 9 illustrates how toner particles behave when the movable member is driven by magnetic force.

FIG. 9 illustrates how toner particles behave when the movable member 101 is driven by a magnetic force in the above embodiments. Magnetic lines of force 702 rise from the magnet 201 provided on the movable member 101. Where toner particles 701 are magnetic-material particles, the toner particles 701 are attracted by magnetic force. In this case, it can be made difficult for the toner particles 701 to reach the magnet 201 directly as in the afore-mentioned embodiments, whereby the detection performance of the potential sensor can be prevented from deteriorating. In this case, the toner particles are attracted at stronger force as they come near to the magnet 201.

The movable member 101 shakes or swings, and hence toner particles 701 attracted at weak force can be filliped off by shake or swing. Some of the toner particles adhere to the movable member 101 on its detecting electrode side, but do not adhere directly to the magnet 201. Hence, they can be filliped off at least by shake or swing. As an example, when a movable member 101 of 1 mm×1 mm in size and 200 μm in thickness is shaken or swung at a frequency of about 20 kHz and at a shake or swing angle of 3 degrees, magnetic-material toner particles adhered to the movable member 101 on its detecting electrode side are almost filliped off. On the other hand, toner particles adhered to the magnet 201 can not be filliped off to lower operation performance as well. More specifically, the shake or swing angle of the movable member 101 decreases, and resonance frequency as well is changed. Therefore, the sensor signals of the potential sensor also become small. According to the above embodiments of the present invention, such situations can be prevented from occurring.

Figure 10:
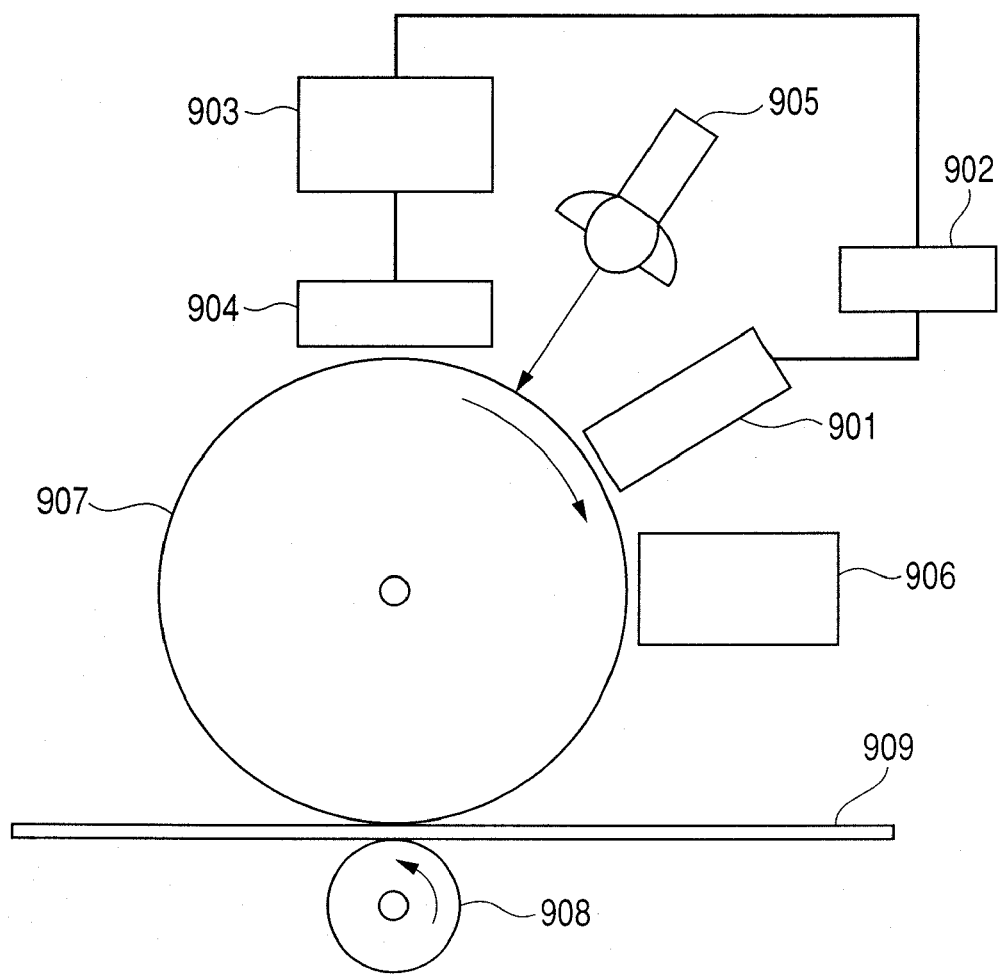
FIG. 10 diagrammatically illustrates an example of an image forming apparatus fitted with the potential sensor of the present invention.

FIG. 10 is a diagrammatic view showing how an image forming apparatus fitted with the potential sensor of the present invention is made up. This image forming apparatus has a potential sensor 901 of the present invention, a signal processing unit 902, a high-voltage generator 903, a charging assembly 904, an exposure unit 905, a toner feed system 906, a transfer medium feed roller 908 and a photosensitive drum (an example of what is termed as the detection object in the present specification) 907, and forms images on a transfer medium 909.

The image forming apparatus is operated in the following way. (1) The photosensitive drum 907 is electrostatically charged by the charging assembly 904. (2) Charged areas are exposed to light by the exposure unit 905 to form latent images. (3) A toner is adhered to the latent images by means of the toner feed system 906 to form toner images. (4) The toner images are transferred to the transfer medium 909. (5) The toner images held on the transfer medium 909 are fused and fixed thereto. Image formation is achieved though these steps. In what is thus made up, the charging assembly 904, the exposure unit 905, the photosensitive drum 907, etc. constitute an image forming means.

Here, the charged state of the photosensitive drum 907 is determined with the potential sensor 901, and the results obtained are processed by the signal processing unit 902, and then fed back to the high-voltage generator 903 as needed, whereby stable drum charging can be realized to achieve stable image formation. In the course of such a sequence of operations, if the operation characteristics of the movable member are changed, the charged state of the photosensitive drum 907 cannot be precisely detected. The use of the potential sensor of the present invention can reduce a change in the characteristics of the movable member or prevent the operation characteristics of the movable member from changing, and hence, enables the charged state of the photosensitive drum 907 to be accurately detected.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-316355, filed Nov. 22, 2006, which is hereby incorporated by reference herein in its entirety.

What is claimed is:

1. A potential sensor which comprises a movable member, a detecting electrode formed on the movable member, a support which movably supports the movable member, a driving mechanism which drives the movable member, and a stationary member which supports the support;

between the movable member and the stationary member, a first gap being so formed as to make the movable member movable; and the first gap having a part that is not larger in width than the maximum size of toner particles when the movable member is at a neutral position.

2. The potential sensor according to claim 1, wherein, between the support and the stationary member, a second gap is so formed as to make the support elastically deformable, and the second gap has a part that is not larger in width than the maximum size of toner particles when the support is not elastically deformed and the movable member is at a neutral position.

3. The potential sensor according to claim 2, wherein the narrowest part of the first gap is set to be narrower than the narrowest part of the second gap.

4. The potential sensor according to claim 1, wherein the narrowest part of the first gap is not larger in width than the maximum size of the toner particles while the movable member is shaken or swung.

5. The potential sensor according to claim 2, wherein the narrowest part of the second gap is not larger in width than the maximum size of the toner particles while the movable member is shaken or swung.

6. The potential sensor according to claim 1, wherein, when the support is not elastically deformed and the movable member is at a neutral position, the sectional shape of each of the gaps is a rectangular shape, a two-stage double-rectangular shape the narrow part of which is on the top side of the gap, a lozenge shape the narrow part of which is on each of the top side and bottom side of the gap, a tapered shape the narrow part of which is on the top side of the gap, or an arc which is curved outward.

7. The potential sensor according to claim 1, wherein a plurality of detecting electrodes are formed on the movable member.

8. An image forming apparatus which comprises the potential sensor according to claim 1 and an image forming unit; the image forming unit being controlled by using sensor signals obtained from the potential sensor.

\* \* \* \* \*